United States Patent [19]

Gibson

[11] Patent Number: 4,465,990

[45] Date of Patent: Aug. 14, 1984

[54] MICROWAVE DETECTOR ARRANGEMENT

[75] Inventor: Peter J. Gibson, Crawley, England

[73] Assignee: U.S. Philips Corporation, New York, N.Y.

[21] Appl. No.: 310,670

[22] Filed: Oct. 13, 1981

[30] Foreign Application Priority Data

Oct. 20, 1980 [GB] United Kingdom ............... 8033796

[51] Int. Cl.³ .......................... H01P 5/00; H03D 9/02
[52] U.S. Cl. .................................... 333/247; 329/162; 329/206
[58] Field of Search ............................. 333/245, 247; 329/160-162, 205 R, 206; 363/126

[56] References Cited

U.S. PATENT DOCUMENTS

| | | | |
|---|---|---|---|
| 2,100,458 | 11/1937 | Walter | 329/205 R |
| 2,679,584 | 5/1954 | MacDonald | 329/205 R X |
| 2,966,586 | 12/1960 | Cole et al. | 329/206 X |
| 3,212,015 | 10/1965 | Kruse, Jr. | 329/162 |
| 3,212,016 | 10/1965 | Day et al. | 329/162 X |
| 3,693,103 | 9/1972 | Mouw | 329/162 |
| 3,912,946 | 10/1975 | Graziadei | 329/205 R X |
| 4,104,594 | 8/1978 | Cann | 329/206 X |
| 4,360,865 | 11/1982 | Yasumura et al. | 333/247 X |

Primary Examiner—Paul L. Gensler
Attorney, Agent, or Firm—Robert J. Kraus

[57] ABSTRACT

A microwave detector arrangement operable over a broad range of frequencies including the series resonant frequency of a detector diode (9) for detecting microwave energy in a transmission line of characteristic impedance $Z_o$, suitably a coplanar line. A first portion of line, including a strip conductor (3), is terminated by a network, including a capacitance (4) and a first resistance (5) in series with one another and with the parallel combination of a second resistance (6) and the diode (9). The capacitance (4) provides D.C. isolation, while the detector output is taken across a capacitance (10) in series with the diode (9). The first and second resistances (5,6) are respectively $2Z_o/3$ and $3Z_o/2$, so that the terminating impedance provides a reasonable match to the line over a broad frequency range.

13 Claims, 3 Drawing Figures

MICROWAVE DETECTOR ARRANGEMENT

BACKGROUND OF THE INVENTION

The invention relates to a broadband microwave detector arrangement comprising a detector diode.

The operating frequency range of a detector arrangement in a waveguide is inherently limited (assuming operation in the dominant mode) to a band between the cut-off frequencies of the dominant mode and the next, higher-order mode.

A detector arrangement in a transmission line may be operable over a broader frequency range, particularly a range extending down to low microwave frequencies. ("Transmission line" is to be understood to be means for propagating a TEM or quasi-TEM wave).

It is generally desirable that a detector arrangement should not reflect a high proportion of incident power; it is also of course desirable that the detector diode itself should absorb a fairly high proportion of incident power and convert it to video frequencies. The impedance of a detector diode may differ greatly from the characteristic impedance of a transmission line to which it is connected, and these criteria may conflict. An arrangement which is suitable for fairly low microwave frequencies is disclosed in U.K. Patent Specification No. 1,385,111. In this arrangement, a diode having an impedance of 200–300 ohms is connected to a 50 ohms transmission line through a low-impedance capacitance and is connected in parallel with a resistance of 75 ohms. This arrangement is not, however, suitable for frequencies approaching the series resonant frequency of the detector diode; in the region of this frequency, the diode shunts the 75 ohms resistance with a low impedance, causing a severe mismatch.

SUMMARY OF THE INVENTION

It is an object of the invention to provide a broadband microwave detector arrangement which is suitable for operation at frequencies in the region of the series resonant frequency of the detector diode and also at frequencies substantially below and/or substantially above the series resonant frequency. The arrangement should have an acceptable VSWR over its operating bandwidth and the detector diode itself should be capable of absorbing a reasonable proportion of incident power.

According to the invention, a broadband microwave detector arrangement comprises a detector diode and a first portion of transmission line (as herein defined). This first portion has a characteristic impedance $Z_o$ and the arrangement is suitable for detecting microwave energy in the first portion at frequencies in the region of the series resonant frequency $f_o$ of the diode and at frequencies substantially below and/or substantially above $f_o$. The first portion of transmission line is terminated by a network comprising a plurality of impedances including a first resistance substantially less than $Z_o$ in series with the parallel combination of the diode and a second resistance not substantially less than $Z_o$, and also including at least one capacitance through which the diode is connected to the first portion of transmission line. The resistive part of the impedance is approximately equal to the sum of the first and second resistances at frequencies differing substantially from $f_o$ and to the first resistance at frequencies in the region of $f_o$.

The capacitance may be connected in series with the diode and in parallel with the second resistance; the arrangement may comprise another capacitance in series with the first resistance and with the parallel combination to provide d.c. isolation from the first portion of transmission line.

The arrangement may comprise one or more additional portions of transmission line connecting impedances of the network to each other. This can alleviate mis-matching within the detector arrangement.

Suitably, the transmission line is a coplanar line. (Such a line is sometimes referred to as coplanar waveguide, which may be abbreviated to CPW). A coplanar line may be constructed in any convenient size appropriate to the operating frequency range of the detector arrangement, enabling the first and/or second resistances to be thin-film resistances and enabling connections within the arrangement to be of minimal length, thus reducing the effective lumped impedances of the connections. Desired values for the first and/or second resistances may then be obtained merely by choosing an appropriate resistance per square, independent of the scale of construction of the line. In particular, the line may be made very small so as to be suitable for high microwave frequencies, limits being set only by techonology required for micro-miniature fabrication and by the physical size of available detector diodes.

Suitably, the portions are on a common substrate and have a common ground plane.

The first resistance may be formed integrally with the central conductor of a portion of coplanar line, for example as a resistive metal layer which also serves as a "seed" layer for the vacuum deposition of a further metal layer of good conductivity for the central conductor.

An additional portion of the coplanar transmission line may have a central conductor connecting the first and second resistances to one another and a ground conductor extending along both sides of and around the end of the central conductor remote from the first resistance. This enables a particularly compact configuration to be obtained. The second resistance may extend between the end of the central conductor and the ground conductor, and suitably is formed integrally therewith.

The first resistance is suitably substantially $2Z_o/3$, and the second resistance is suitably substantially $3Z_o/2$.

BRIEF DESCRIPTION OF THE DRAWING

Embodiments of the invention will now be described, by way of example, with reference to the accompanying diagrammatic drawing, in which.

DESCRIPTION OF THE PREFERRED EMBODIMENTS

Figure 1:
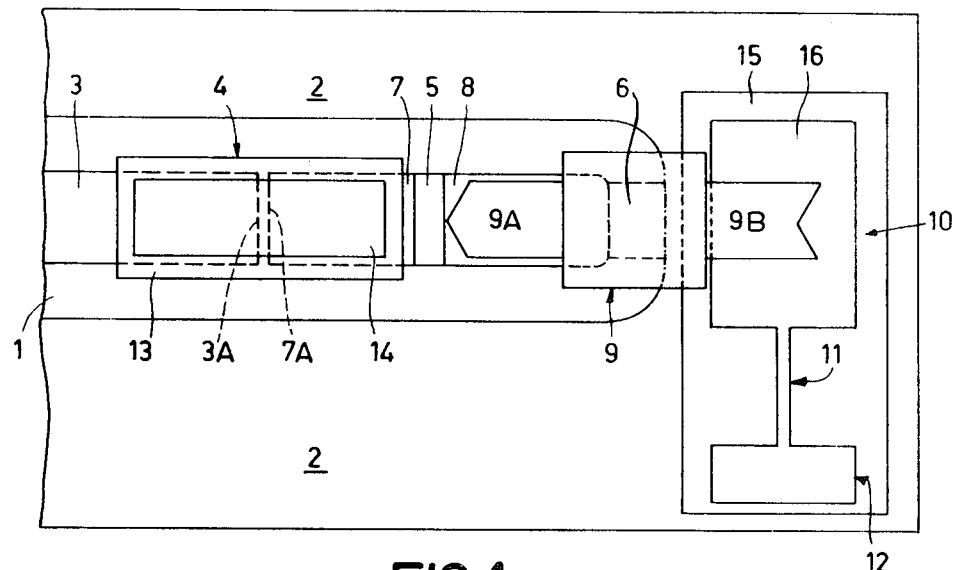
FIG. 1 is a plan view of a microwave detector arrangement embodying the invention.

The detector arrangement shown in FIG. 1 is in the form of a coplanar line on a dielectric substrate 1. All of the major surface of the substrate 1 that appears in the Figure is covered with a conductive ground plane 2 except for a U-shaped slot which extends horizontally across the Figure from the left-hand edge thereof; strip conductors extend on the substrate within and along the slot, being spaced from the edges of the slot, to form portions of coplanar line. A strip conductor 3 of a first portion of coplanar line supplies, in use, signals to be detected by the arrangement. The line is terminated by a network comprising three impedances connected in series with one another, the impedances being respectively a capacitance 4, a first resistance 5 and a second resistance 6. The resistances are formed of uniform resistive layers. Capacitance 4 and resistance 5 are connected together by a second portion of coplanar line comprising a strip conductor 7, and resistances 5 and 6 are connected together by a third portion of coplanar line comprising a strip conductor 8. The ground plane 2 is common to the three portions of coplanar line.

A beam-lead detector diode 9 is disposed above the substrate over the second resistance 6. One lead 9A of the diode is connected to strip conductor 8; the other lead 9B is connected to one plate of a capacitance 10 which in turn is connected via an inductive transmission line 11 to one plate of another capacitance 12. Elements 10-12 form a low-pass filter.

Strip conductors 3 and 7 of the first and second portions of coplanar line have closely adjacent but spaced transverse edges 3A and 7A respectively. Capacitance 4 comprises a layer 13 of dielectric directly overlying the strip conductors 3 and 7 and also overlying the substrate adjacent their side edges. On the dielectric layer is a further strip conductor 14 which is aligned with strip conductor 3 and 7 to form respective capacitances therewith: capacitance 4 thus comprises two capacitances in series with one another. The low-pass filter connected to the diode 9 analogously comprises a layer 15 of dielectric on the ground plane 2, a conductor 16 on the dielectric layer being shaped so as to form one plane of each of the capacitances 10 and 12 and an inter-connecting narrow strip conductor of the inductive transmission line 11.

In the arrangement shown in FIG. 1, the resistive layer forming the resistance 6 extends only between the end of the strip conductor 8 and the ground plane 2, the layer being of uniform resistivity. In the modification shown in FIG. 2, the resistive layer also extends between each side of conductor 8 and the ground plane 2, and the resistance is graded so that the resistivity of the layer increases with increasing distance from the end of the conductor remote from the first resistance 5, for example up to a maximum of 1000 ohms per square.

Figure 3:
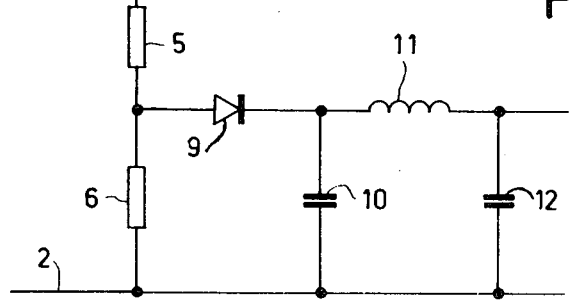
FIG. 3 is an equivalent circuit diagram of the arrangement.

FIG. 3 is an equivalent circuit diagram in which circuit elements are identified by the corresponding reference numbers from FIG. 1. It can be seen that the diode 9 is connected in parallel with the second resistance 6 (so that current flowing through the terminating network from the first portion of transmission line formed by strip conductor 3 and ground plane 2 divides between the resistance 6 and the diode); that this parallel combination is connected in series with the first resistance 5 and the capacitance 4; and that the diode is connected to the first portion of line through capacitance 4 and through capacitance 10, so that current flowing through the diode from the line passes through each capacitance.

FIG. 3 does not show the equivalent circuit of the detector diode itself, but this may be considered as including a series resistance (which for microwave beam-lead diodes is typically in the range of 5-10 ohms) and the combination of an inductance and a capacitance in series with one another. For microwave beam-lead diodes, this series resistance is typically in the range of 5-10 ohms, and the series resonant freqency $f_o$ (at which the impedances of this inductance and this capacitance are of equal magnitude but opposite sign) is typically in the range of 30-40 GHz when mounted in the circuit. At frequencies substantially below and substantially above $f_o$, e.g. below 20 GHz and above 40 GHz for an $f_o$ of 30 GHz, the diode has a high impedance which is predominantly due respectively to its capacitance and to its inductance; at frequencies in the region of $f_o$, the diode has a low impedance which is predominantly due to its series resistance. As a result, at frequencies substantially below $f_o$ and substantially above $f_o$, the terminating impedance presented by the network to the first portion of transmission line is mainly determined by the sum of the first and second resistances, the diode acting as a voltage detector, and at frequencies in the region of $f_o$, the terminating impedance of the network is mainly determined by the first resistance, the diode acting as a current detector. The values selected for the first and second resistances represent a compromise between maximizing the power absorbed by the diode and obtaining an acceptable VSWR; suitable values have been found to be 33 ohms and 75 ohms, respectively, for an operating range extending from substantially below $f_o$ to substantially above $f_o$.

The output of the detector diode (at video frequencies) may be taken across a capacitance electrically-connected between the diode and the first portion of transmission line. In the arrangement of FIG. 1, there are two such capacitances, namely capacitance 4 and capacitance 10; in this instance, the diode output is taken across capacitance 10, the capacitance 4 providing d.c. and low frequency isolation.

A detector arrangement as shown in FIG. 1 was made as follows. The substrate 1 was of alumina ¼ mm thick. Two metal layers were deposited in vacuum over the whole of the substrate area used for the arrangement: first a nickel-chromium alloy "seed" layer having a resistivity of 100 ohms per square was produced by sublimination, and second a gold layer 300 nm thick was produced by evaporation. The gold was then electroplated to a total thickness of 2 $\mu$m. The conductors 2, 3, 7 and 8 and the resistances 5 and 6 were then formed from the metal layers by photolithography. Silica was then sputtered through a mask to form the dielectric layers 13 and 15 with a thickness of 2 $\mu$m. Finally, the conductors 14 and 16 were formed by vacuum deposition, through a mask, of a nickel-chromium alloy and of gold as above, the gold being subsequently electroplated. The beam-lead diode was connected by thermocompression bonding.

Figure 2:
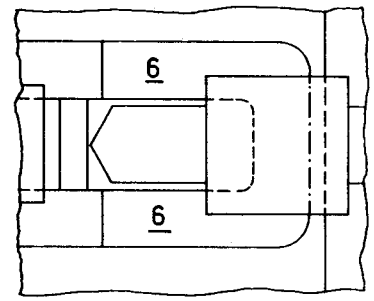
FIG. 2 shows a modification of part of the embodiment of FIG. 1.

The graded resistance shown in FIG. 2 may be made by ion-beam etching of a resistive layer at a controlled rate which is varied along the resistance.

An embodiment of the form shown in FIG. 1 has been tested at frequencies up to 40 GHz; satisfactory operation was obtained up to that frequency, the return loss being better than 10 dB (implying a VSWR better than 2:1), and is thought to continue to much higher frequencies. Tests were made with a number of different diodes, including Alpha type DC6606 and Hewlett-Packard types 5082-2716 and 5082-2764; the circuit performance was substantially the same in all cases.

I claim:

1. A microwave detector arrangement including a detector diode for detecting microwave energy in a portion of transmission line having a characteristic impedance $Z_o$, at frequencies in a broad band including the series resonant frequency $f_o$ of the diode, said arrangement including a terminating network electrically-connected to the transmission line and comprising a plurality of impedances including:
   a. a first resistance having a magnitude substantially smaller than $Z_o$; and
   b. a parallel combination comprising the diode and a second resistance, said combination being electrically-connected in series with the first resistance;
   the first and second resistances having magnitudes such that, over said broad band of frequencies, the sum of the first resistance and the impedance of the parallel combination substantially matches that of the characteristic impedance $Z_o$, the magnitude of the second resistance being sufficiently large to enable effective operation of the diode as a current detector at $f_o$ and at frequencies near $f_o$, and as a voltage detector at frequencies substantially different from $f_o$.

2. A detector arrangement as in claim 1 where said impedances include a filter capacitance connected in series with the diode.

3. A detector arrangement as in claim 2 where said impedances further include a filter capacitance in series with the first resistance.

4. A detector arrangement as in claim 1, 2 or 3 including additional portions of transmission line interconnecting said impedances of the terminating network.

5. A detector arrangement as in claim 4 where the transmission line is a coplanar line.

6. A detector arrangement as in claim 5 where the additional portions of transmission line are disposed on a common substrate and have a common ground plane conductor.

7. A detector arrangement as in claim 6 where said transmission line includes spaced-apart central conductors electrically-connected by said first resistance which bridges the space between said central conductors.

8. A detector arrangement as in claim 6 including a central conductor electrically connecting said first and second resistances, said ground plane conductor extending along opposite sides of the central conductor and around the second resistance.

9. A detector arrangement as in claim 8 where the second resistance electrically-connects the central conductor and the ground plane conductor.

10. A detector arrangement as in claim 9 where the second resistance bridges a gap between the central conductor and the ground plane conductor.

11. A detector arrangement as in claim 10 where the second resistance is a graded resistance having a resistivity which increases with distance from the central conductor.

12. A detector arrangement as in claim 9 where the diode is disposed above the second resistance.

13. A detector arrangement as in claim 1, 2 or 3 where the magnitudes of the first and second resistances are approximately $2Z_o/3$ and $3Z_o/2$, respectively.

* * * * *